US008289680B2

(12) United States Patent
Keegan et al.

(10) Patent No.: US 8,289,680 B2
(45) Date of Patent: Oct. 16, 2012

(54) POWER BUS SYSTEM AND METHOD

(75) Inventors: Jeremy J. Keegan, Kewaskum, WI (US); Rangarajan M. Tallam, Germantown, WI (US); Scott D. Day, Richfield, WI (US); Abdolmehdi Kaveh Ahangar, Cedarburg, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 117 days.

(21) Appl. No.: 12/837,670

(22) Filed: Jul. 16, 2010

(65) Prior Publication Data

US 2012/0014039 A1   Jan. 19, 2012

(51) Int. Cl.
*H02B 1/20* (2006.01)
*H02B 1/26* (2006.01)
*H02B 1/04* (2006.01)

(52) U.S. Cl. ........ 361/611; 361/638; 361/644; 361/650; 174/68.2; 174/71 B; 174/117 R; 174/149 R; 439/117; 439/213; 439/527; 439/798

(58) Field of Classification Search .................. 361/601, 361/605, 611–615, 637–640, 650, 648, 658, 361/644; 174/70 B, 71 B, 72 B, 68.2, 117 R, 174/149 R, 149 B, 88 B, 99 B, 133 B, 129 B; 439/94, 110, 212, 213, 117, 798, 116, 121, 439/527
See application file for complete search history.

(56) References Cited

U.S. PATENT DOCUMENTS

| | | | | |
|---|---|---|---|---|
| 2,969,421 A | * | 1/1961 | Scott, Jr. | 174/117 R |
| 3,210,716 A | * | 10/1965 | Meacham | 439/117 |
| 3,509,514 A | * | 4/1970 | Koenig et al. | 439/117 |
| 3,786,313 A | * | 1/1974 | Coles et al. | 361/644 |
| 4,030,794 A | * | 6/1977 | Rozenboom et al. | 439/213 |
| 4,419,715 A | * | 12/1983 | Pear | 361/638 |
| 4,778,412 A | * | 10/1988 | Walter et al. | 439/798 |
| 5,021,014 A | * | 6/1991 | Walter et al. | 439/798 |
| 5,876,224 A | * | 3/1999 | Chadbourne | 439/110 |
| 6,045,379 A | * | 4/2000 | Wagener | 439/212 |
| 6,069,321 A | * | 5/2000 | Wagener et al. | 174/99 B |
| 6,381,122 B2 | * | 4/2002 | Wagener | 361/611 |
| 6,435,888 B1 | * | 8/2002 | Reed, Jr. | 439/213 |
| 6,870,103 B1 | * | 3/2005 | Wiant et al. | 174/68.2 |
| 7,847,193 B2 | * | 12/2010 | Espeseth et al. | 174/149 R |

* cited by examiner

*Primary Examiner* — Michail V Datskovskiy
(74) *Attorney, Agent, or Firm* — Fletcher Yoder, P.C.; Alexander R. Kuszewski; John M. Miller

(57) ABSTRACT

Embodiment relate to an extruded high power electrical distribution. The bus can be employed in a MCC, a drive cabinet, or any such electrical enclosure to facilitate transmission of power. A body of the bus includes an elongate metal extrusion with first and second ridges extending along a length of the body from opposite edges of the body. Further, the bus includes a first groove and a second groove extending along the length of the body and into the body from a face of the body such that each of the first and second grooves comprises a cross-section having a narrow passage extending from the face into a broader cavity within the body. Additionally, the bus includes machined openings into each groove, wherein each of the machined openings is wider than the width of the corresponding groove to which it provides access.

26 Claims, 12 Drawing Sheets

POWER BUS SYSTEM AND METHOD

BACKGROUND

The present invention relates generally to the field of power electronic devices such as those used in power conversion or applying power to motors and similar loads. More particularly, the invention relates to an extruded electrical distribution bus and associated systems and methods.

In the field of power electronic devices, a wide range of circuitry is known and currently available for transmitting, converting, producing, and applying power. Depending upon the application, such circuitry may transmit incoming power to various devices and/or convert incoming power from one form to another as needed by a load. In a typical drive system arrangement, for example, constant (or varying) frequency alternating current power (such as from a utility grid or generator) is converted to controlled frequency alternating current power to drive motors, and other loads. In this type of application, the frequency of the output power can be regulated to control the speed of the motor or other device. Further, drive system buses may transmit the power throughout the process. In a motor control center application, a bus system may facilitate transmission of power to a number of system components and devices. For example, a motor control center bus may be utilized to provide power to a drive system bus.

Circuitry such as that detailed above may be employed with differing levels of incoming power for different load requirements. For example, power may be taken from a high voltage electrical grid and converted for use with a high horse power motor or the like. Alternatively, such circuitry may be utilized to simply distribute power to different devices via a motor control center bus. Circuitry for providing such functionality is often packaged together. Indeed, electrical systems with packaged electrical and electronic components, such as drive cabinets and motor control centers, are known and in use. For example, motor control centers (MCCs) are used for power and data distribution in large industrial operations, and drive cabinets are used for power conversion and distribution. In a typical MCC and/or drive cabinet a variety of components are housed in large electrical enclosures that may be subdivided into compartments. For example, an MCC may include components such as switchgear, semiconductor power electronic circuits, programmable logic controllers (PLCs), motor controllers, and so forth. A drive cabinet may include a rectifier (converter), an inverter, transitional attachments, and so forth. Further, such electrical enclosures may include bus work that communicatively couples the components with a power source and/or other components.

Typically, an MCC or drive cabinet is connected to a main power line that provides three-phase AC power for transmission or conversion as needed by a particular load. Accordingly, the MCC or drive cabinet includes associated bus work, interconnections, and supporting structures for distribution of electrical power to the various components. Traditionally, such bus work is manufactured to a specific length with punched holes or a combination of cabling and bus work to provide for electrical transmission to components. Such bus work may be directly affixed to the cabinet by a fastener (e.g., a nut and bolt assembly) and a non-conductive standoff. Such bus work and attachment features can be complex, expensive, nonadjustable and/or difficult to configure. For example, traditional bus work may be generally cumbersome and only enable coupling of attachment features at specific locations on the bus (e.g., punched holes along the bus). Additionally, traditional bus systems and support structures require substantial changes to accommodate different amperage levels.

Accordingly, it is now recognized that it would be desirable to develop a bus system that facilitates communicative coupling to high power drives and the like in a flexible configuration, enables simplified manufacturing changes to accommodate different amperage levels and cabinet arrangements, and enables convenient coupling of attachment features at generally any location along the bus.

BRIEF DESCRIPTION

According to one embodiment of the present invention, an extruded high power electrical distribution bus is provided. Such a bus can be employed in an MCC, a drive cabinet, or any such electrical enclosure to facilitate transmission of power. A body of the bus includes an elongate metal extrusion with first and second ridges extending along a length of the body from opposite edges of the body. Further, the bus includes a first groove and a second groove extending along the length of the body and into the body from a face of the body. Each of the first and second grooves comprises a cross-section having a narrow passage extending from the face into a broader cavity within the body, such as a T-shaped or L-shaped groove cross-section. Additionally, the bus includes machined openings into each groove, wherein each of the machined openings is wider than the width of the corresponding groove to which it provides access.

Present embodiments may include a method, such as an extrusion process, for forming an elongate metal extrusion that includes a first ridge and a second ridge extending along a length of a body from opposite edges of the body, and a first groove and a second groove positioned along the length of the body and extending into the body from a face of the body. The extrusion process utilizes an extrusion die that generates the first and second grooves within the body such that a cross-section of each groove includes a narrow passage extending from a face of the body into a broadened cavity within the body. The method may also include a machining process for providing openings into the grooves such that the grooves can accommodate insertion of an attachment feature having an enlarged distill end and a narrowed neck. Once inserted into the first groove or the second groove, the attachment feature can slide along the groove into which it was inserted and engage the enlarged distill end with the broader cavity and engage the narrowed neck with the narrow passage.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique function to provide a bus system that facilitates flexible configuration and connection of components to a bus bar within an electrical enclosure, such as an MCC or drive cabinet. In particular, the present technique provides an extruded bus bar, attachment features and support features for the bus bar, wherein the bus bar includes ridges extending from opposite edges of a body of the bus bar and at least a pair of grooves disposed in a face of the bus bar. A support feature includes an insulated bracket that receives the bus bar into a receptacle and allows the bus bar to essentially float within the receptacle without rigid attachment.

References in the specification to "one embodiment," "an embodiment," or "an exemplary embodiment," indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
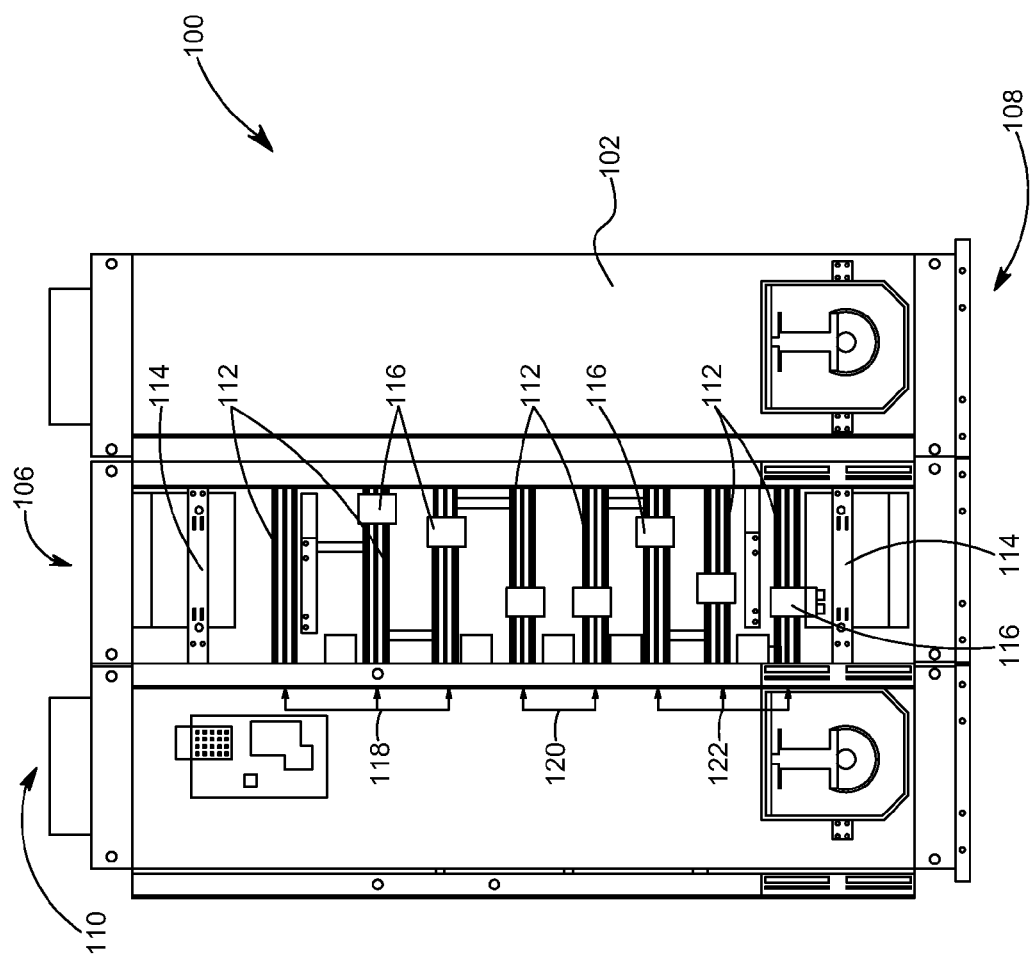
FIG. 1 is a front view of an electrical enclosure including a bus system in accordance with present embodiments.

Turning now to the drawings and referring to FIG. 1, an electrical enclosure 100 is illustrated in which electrical components of various types may be housed and connected via a bus system that includes bus bars, connection features, and a support system. The enclosure 100 may be representative of a motor control center or other industrial, commercial, or marine electrical system. In general, the enclosure 100 provides a protective shell around various electrical components and the bus system. For example, the enclosure 100 may include a shell 102 made of any suitable material, such as heavy gauge sheet metal, reinforced plastic, and so forth. Further, the enclosure 100 may include devices such as a programmable logic controller, switches, motor controls, inverters, rectifiers, and so forth disposed along and/or coupled with the bus system. Specifically, in the illustrated embodiment, the enclosure 100 includes a wiring bay section 106 positioned between a pair of power drive sections 108, 110.

A set of bus bars 112 passes along a back wall of the enclosure 100 and through each of the enclosure sections (i.e., the wiring bay section 106 and each of the drive sections 108, 110). A pair of ground bars 114 also passes through the enclosure sections. The bus bars 112 are made of conductive material (e.g., copper or aluminum) that has been extruded to a desired length for use with the enclosure 100. Additionally, as will be discussed in detail below, the bus bars 112 are extruded with certain cross-sectional features that facilitate communicatively coupling the bus bars 112 with expansion or attachments features 116 and devices. These cross-sectional features also facilitate cooperation with a support system that couples the bus bars 112 to the enclosure 100 and provides flexibility in configuration of the bus system (e.g., expansion of bus bar capacity) without requiring substantial changes in the bus system. Indeed, each of the bus bars 112 is held in place within the enclosure 100 with a support system that includes bus support brackets that are formed or molded from a thermalset glass reinforced material or a non-conductive material to coordinate with aspects of the cross-sectional features. Specifically, as will be discussed in further detail below, the support brackets each include openings into which one of the bus bars 112 can slide. Each support bracket includes a main opening with slots that correspond to cross-sectional features of the bus bars 112 such that the bus bars 112 can be retained without being fastened to the brackets. In some embodiments, end caps or the like may be positioned near or around the ends of the bus bars 112 such that the bus bars 112 can essentially float within the brackets without substantial lateral sliding.

Figure 2:
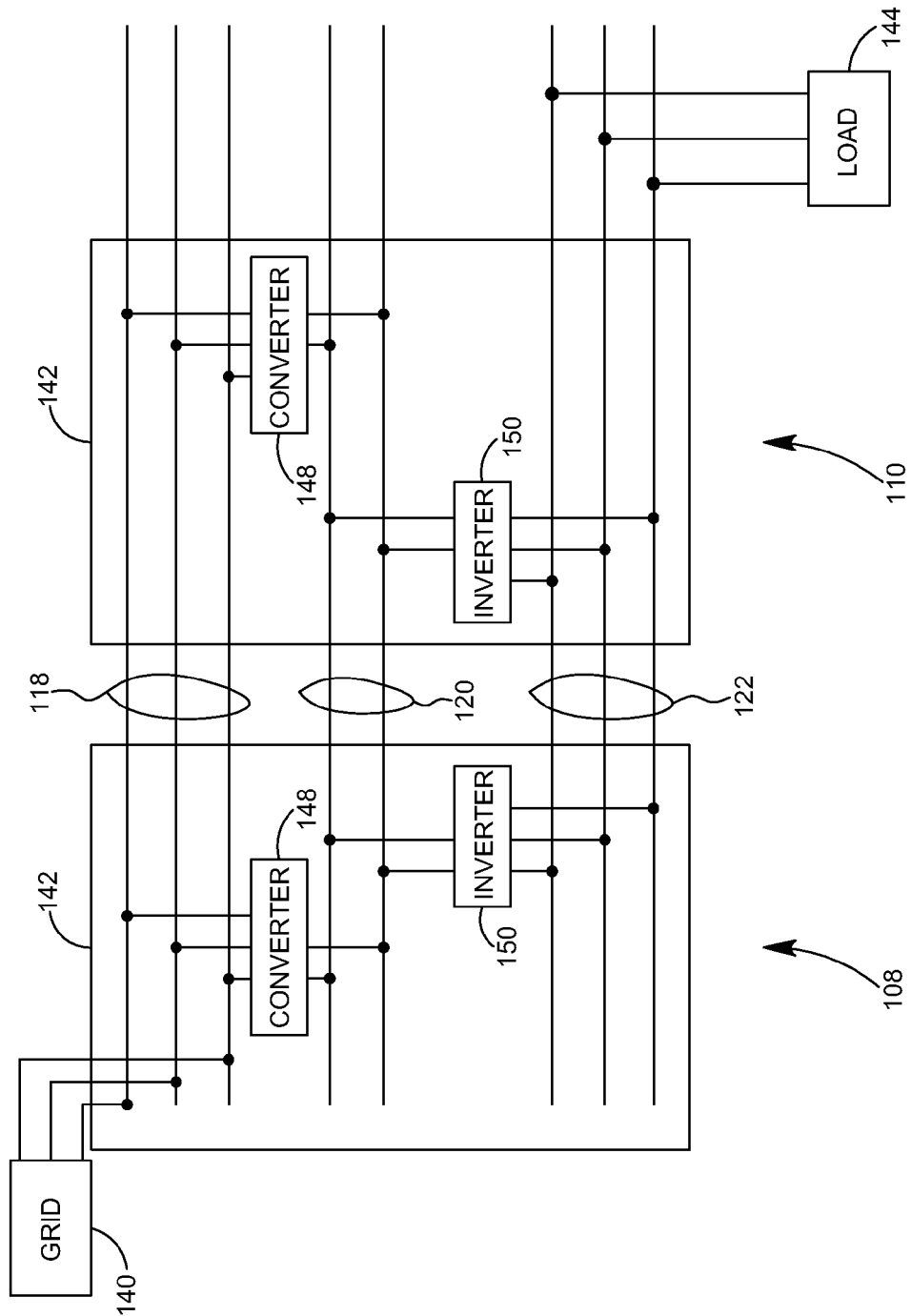
FIG. 2 is a block diagram of a pair of drive systems utilizing a bus system in accordance with present embodiments.

During operation of the illustrated embodiment, the set of bus bars 112 receives power and transmits the power to various components within the enclosure 100. An upper three bus bars 118, a middle two bus bars 120, and a lower three bus bars 122 of the set of bus bars 112 may each perform a different function. Specifically, as illustrated by the block diagram in FIG. 2, the bus bars 112 function to provide three-phase AC power from an electrical grid 140 to drive systems 142 of the drive sections 108, 110 that function to reduce the three-phase AC power from the grid 140 to a level that is desirable for a particular load 144, such as a motor. That is, the bus bars 112 function to transmit power to the drive systems 142 at a voltage and frequency of the grid 140, transmit power within the drive systems 142 as direct current, and transmit power out of the drive systems 142 to the load 144 at a desired voltage and frequency for the load 144.

Specifically, the upper three bus bars 118, which may be referred to as line bus bars 118, are coupled to the power supply grid 140 and a rectifier or converter 148 of each drive system so that three-phase AC power from the grid 140 is provided to the drive systems 142. In some embodiments, the three-phase AC power from the grid 140 may also be provided to other components within or related to the enclosure 100, such as an MCC bus and devices along the MCC bus. Once the three-phase AC power is provided to the rectifier or converter 148 within each of the power drive sections 108, 110, the rectifiers 148 convert the three-phase AC power to DC power, which is then transmitted to an inverter 150 in each of the power drive sections 108, 110 via the middle two bus bars 120. Accordingly, the middle two bus bars 120 may be referred to as DC bus bars 120. The inverters 150 receive the DC power from the DC bus bars 120 and convert it to three-phase AC power that is appropriate for the load 144 via inverter circuitry, which typically includes several high power switches, such as a drive circuit and insulated-gate bipolar transistors (IGBTs). This output power is then provided to the load via the lower three bus bars 122, which may be referred to as load bus bars 122.

As set forth above, the bus bars 112 provide power to various different components of the drive systems 142 and other features. This is achieved, in accordance with present embodiments, by communicatively coupling the various devices to the bus bars 112 via attachment or connection features 116. The connection features 116 interlock with grooves in the bus bars 112 via bus clamps or the like. Due to the nature of the grooves in the bus bars 112, the connection features 116 can generally slide along the bus bars 112 and secure to any location along the bus bars 112 such that the connection features 116 can easily be positioned for connection with a device, power source, or the like. Indeed, the connection features 116 may also couple directly to devices and/or couple with cabling or the like that in turn couples with the devices. This facilitates power transmission between the bus bars 112 and other electrical features via the connection features 116. For example, each of the line bus bars 118 is coupled with the grid 140 via one of the connection features 116 and a cable that interconnects with both the attachment connection feature 116 and grid wiring. Various types of attachment or connection features 116 will be discussed in further detail below.

Figure 3:
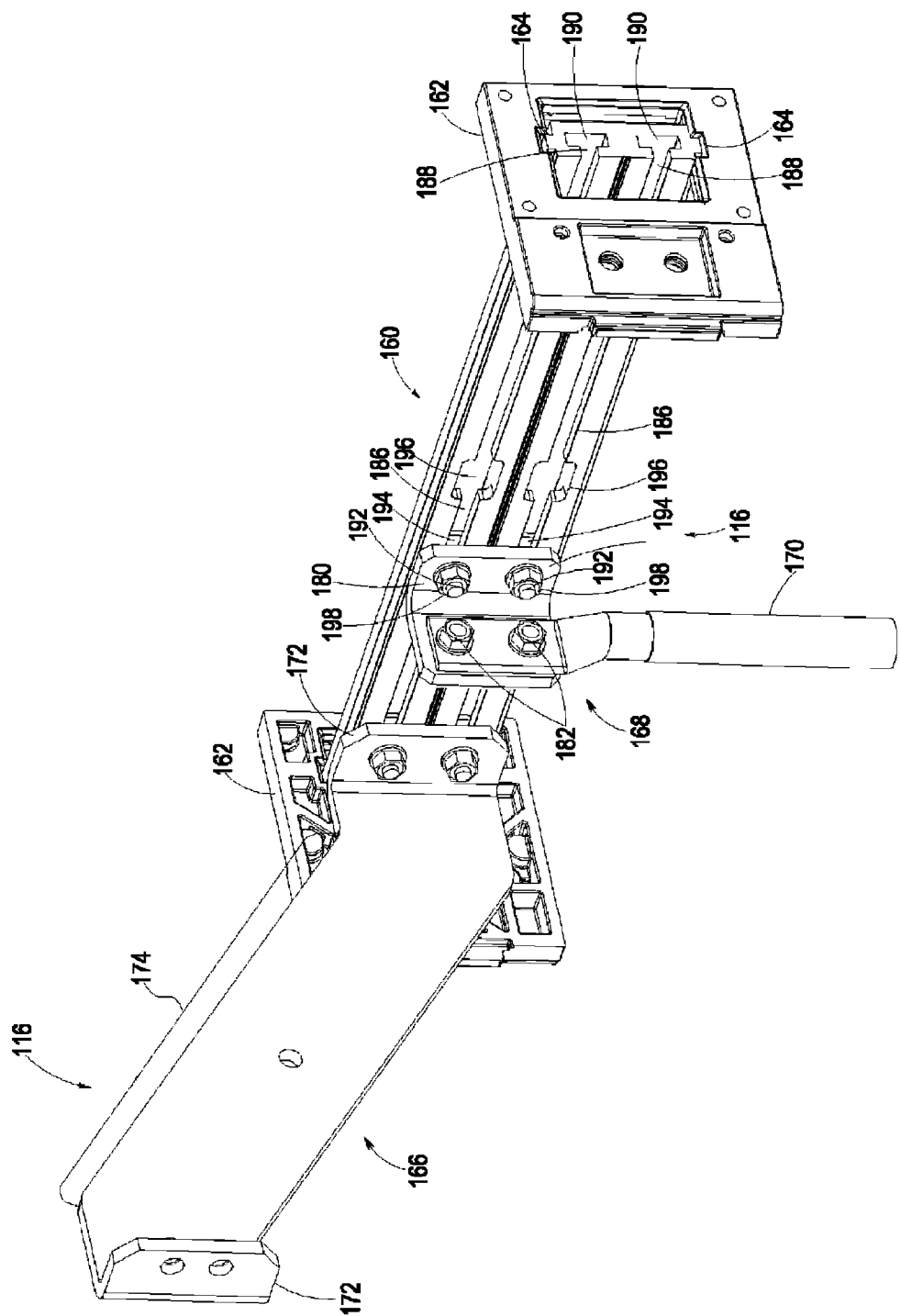
FIG. 3 is a perspective view of a bus bar that is retained by a pair of support brackets and coupled to a pair of attachment features in accordance with present embodiments.

FIG. 3 is a perspective view of a bus bar 160 that is retained by a pair of support brackets 162 and coupled to a pair of attachment features 116 in accordance with present embodiments. The bus bar 160 is extruded metal and can be extruded to a desired length for its application. The bus bar 160 is also extruded such that it includes particular cross-sectional characteristics that facilitate operation in accordance with present embodiments. Further, different metals may be used to provide different functionality. For example, depending on the level of power being transmitted, the bus bar 160 may be extruded from aluminum or copper.

With regard to the support features, the bus bar 160 is shown disposed within molded brackets 162 that are formed (e.g., molded) from non-conductive material. The brackets 162 are configured to slidably receive the bus bar 160 into a receptacle disposed within the bracket and to attach with an enclosure (e.g., the enclosure 100) or other support features. As can be seen in FIG. 3, the support brackets 162 do not necessarily couple directly to the bus bar 160 but engage with cross-sectional features 164 (e.g., ridges) of the bus bar 160 to prevent rotation or movement in certain directions, while allowing the bus bar 160 to float laterally. The brackets 162 also include features that can accommodate adjustments to the bus bar 160, as will be discussed in further detail below.

With regard to the features coupled to the bus bar 160, the illustrated attachment features 116 include a side bus 166 that functions as a perpendicular extension of the bus bar 160 and a cable attachment 168 that functions to communicatively couple the bus bar 160 with a cable 170. Specifically, the side bus 166 includes a pair of brackets 172 disposed at each end of an angled extension 174, which is generally a parallelepiped. The side bus 166 may enable communicative coupling between the bus bar 160 and a power core or the like. The cable attachment 168 includes an angled bracket 180 with coupling features 182 for attaching to the bracket 180 and the cable 170. The cable attachment 168 may facilitate communicative coupling between the bus bar 160 and a power grid or the like.

Figure 4:
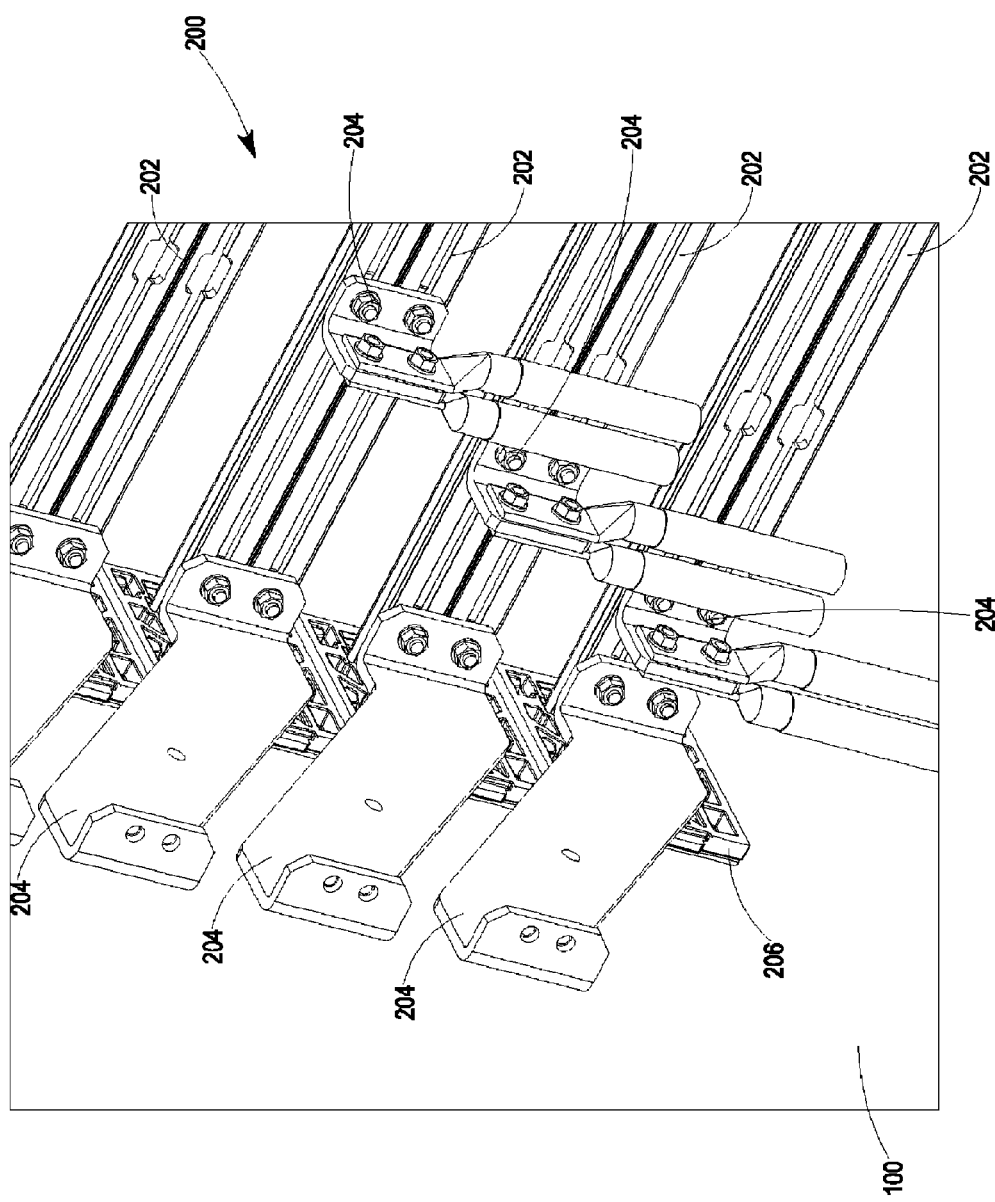
FIG. 4 is a perspective view of a bus system disposed within an enclosure in accordance with present embodiments.

As an example, FIG. 4 includes a perspective view of a bus system 200 disposed within an enclosure 100 in accordance with present embodiments. The bus system 200 includes various bus bars 202, attachment features 204, and support features 206. The arrangement of features in FIG. 4 demonstrates aspects of the flexibility of present embodiments. For example, each of the bus bars 202 is capable of making multiple connections to the attachment features 204 at essentially any location along the bus bars 202. Specifically, for example, the lowermost bus bar 208 in FIG. 4 is coupled to multiple attachments including a side bus and a cable attachment. The arrangement of the bus bars 202 in the cabinet and the use of coupling features 204, such as the cable attachments, illustrate the accessibility of present embodiments. For example, connections may be brought into and/or out of the cabinet from a top or bottom of the cabinet and coupled with one of the bus bars 202 via an attachment feature that can be positioned anywhere along one of the bus bars 202. Additionally, due to the nature of the bus bars 202 and associated attachments, connections can essentially come from any direction. Specifically, for example, power could be provided via a cable that passes through a bottom or top of the cabinet and attaches to the lowermost or uppermost bus bar 202 via a cable attachment coupled to the bus bar 202. FIG. 4 also illustrates the flexibility of a support system in accordance with present embodiments. For example, the side buses are coupled to support features 206, which not only support the side buses but also provide support for the bus bars 202 via the attachment to the side busses.

Returning to FIG. 3, each of the illustrated attachment features 116 is configured to couple with grooves 186 in the bus bar 160. The grooves 186 have a cross-section that includes a narrow channel 188 with an expanded cavity 190. Thus, the grooves 186 can slideably receive a component of the attachment features 116 with a narrow neck and an expanded distill end. In other words, a component of an attachment feature including a narrow neck and an expanded distill end can slide along one of the grooves 186 when the narrow neck is positioned within the narrow channel 188 and the expanded distill end is positioned within the expanded cavity 190. For example, in the illustrated embodiment, the cable attachment 168 includes a pair of bolts 192 that pass through the bracket or body 180 of the cable attachment 168 and into the grooves 186. The bolts 192 are each coupled or integral with separate plate features 194 that are slideably positioned within the expanded cavity 190 of the corresponding grooves 186. The plate features 194 may be inserted into the corresponding grooves 186 at an end of the bus bars 160 or via openings 196 that are machined into each of the grooves 186. By positioning the bolts 192 and plates 196 within the grooves 186 in this manner, nuts 198 can be tightened onto each of the bolts 192 such that the plate features 194 are pulled against an inner lip of each groove 186. Thus, the cable attachment feature 168 is securely fastened to the bus bar 160.

Multiple grooves 186 are employed in the face of the bus bar 160 to reduce moment of the attachment features 116 about the bus bar 160 and to facilitate uniform contact between the bus bar 160 and the attachment features 116. Indeed, in accordance with present embodiments, the torque present when the bus bar 160 is coupled with the attachment features 116 facilitates the provision of communicative contact between the bus bar 160 and the attachment features 116. It should be noted that while two grooves 186 are provided in the embodiment illustrated by FIG. 3, in other embodiments, additional grooves may be included.

Figure 5:
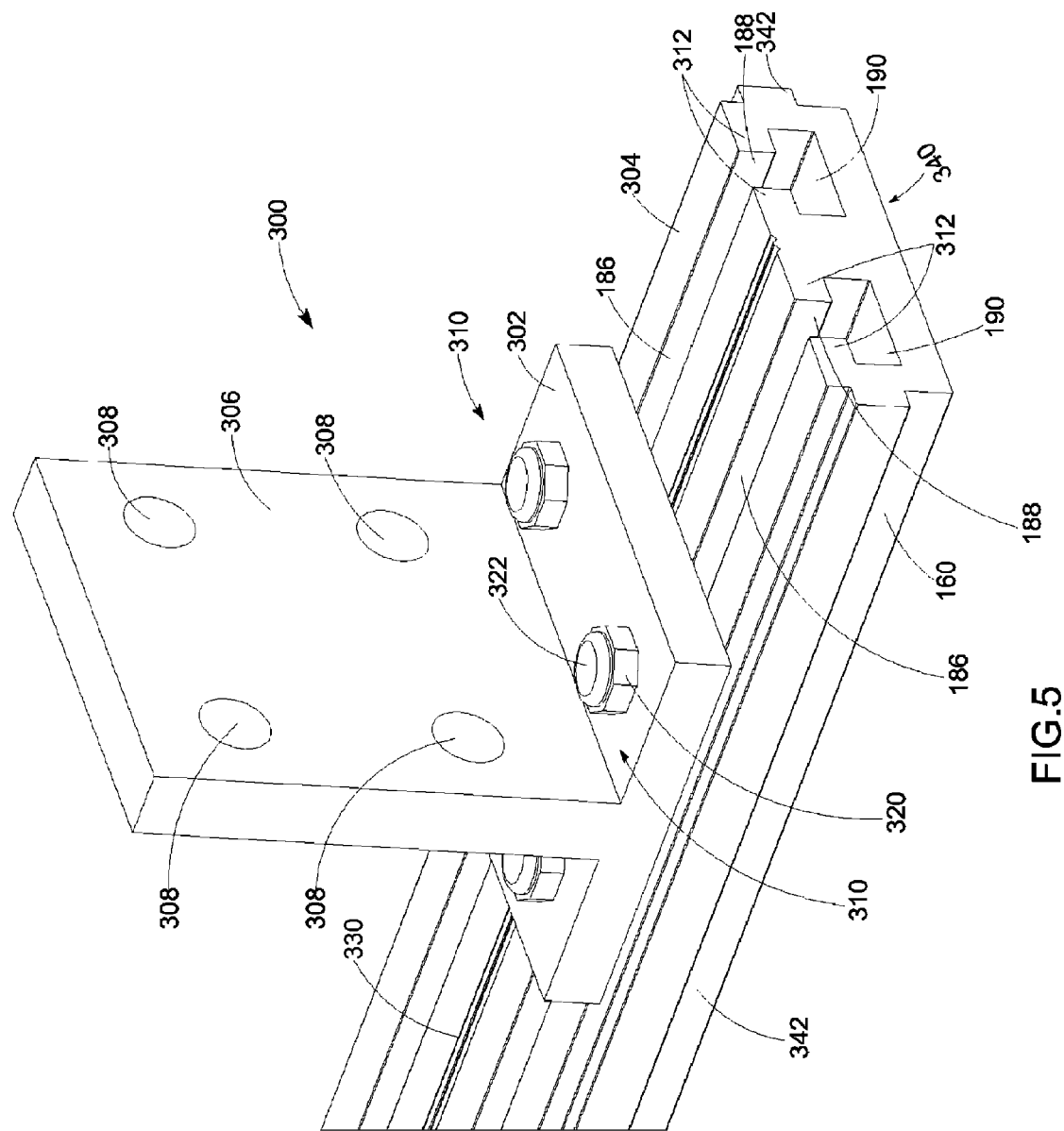
FIG. 5 is a perspective view of a perpendicular connection feature coupled to a bus bar in accordance with present embodiments.

FIG. 5 is a perspective view of a perpendicular connection feature 300 coupled to the bus bar 160. The connection feature 300 includes a base portion 302 that is positioned adjacent a face 304 of the bus bar 160. The connection feature 300 also includes a rectangular plate 306 that extends generally perpendicularly from the base 302, and, thus, extends generally perpendicularly from the bus bar 160. The connection feature 300 includes a set of holes 308 in the rectangular plate 306 that may be utilized to couple with a cable, another bus bar, a device, or the like. As with previously described attachment features 116, the perpendicular connection feature 300 couples to the bus bar 160 via fasteners 310 that include a portions that extend through the narrow channels 188 of the grooves 186 and into the expanded cavities 190 of the grooves such that they slideably engage the grooves 186. This sliding engagement facilitates connection of components with the bus bar 160 at any location on the bus bar 160 without added hardware or support. Additionally, the attachment features 116 coordinate with the grooves 186 to enable tightening about lips 312 of each groove 186 that extend toward the narrow channel 188 and over the expanded cavity 190 of each groove 186. In the illustrated embodiment, the fasteners 310 are bus clamps that include nuts 320 that tighten about a bolt 322 to press the base portion 302 against the lips 312 of each groove 186 by drawing in a plate or other expanded distill end (not shown) of the bolt 322 positioned within the expanded cavity 190 of the groove 186.

FIG. 5 also clearly illustrates a pair of small grooves or channels 330 positioned between the grooves 186. A number of these channels 330 may correspond to a particular characteristic of the bus bar 160. For example, it may be desirable to provide the channels 330 as a readily accessible indication of the capacity of the bus bar 160. Indeed, in accordance with present embodiments, a base or rear portion 340 of the bus bar 160 that is positioned beneath the grooves 186 and opposite the face 304 of the bus bar 160 may be configurable during the extrusion process so that different thicknesses can be provided for different applications without changing the geometry of the grooves 186 and other characteristics of the bus bar 160 and/or system. For example, the rear portion 340 can be expanded or reduced depending on the quantity of power that the bus bar 160 is configured to transmit without changing the size of the grooves 186 or the positioning of ridges 342 along opposite edges of the bus bar 160. This not only provides consistent groove geometry for coupling attachment features 116 with the bus bar 160 but constancy with regard to support features, such as the support brackets 162, for retaining the bus bar 160 within an enclosure.

Different thicknesses of the bus bar 160 can provide different characteristics that it is desirable for a user to be able to readily discern. Since the expansion of the bus bar 160 is on a rear portion that may not be extremely visible to a user when installed, a number of the small channels 330 may be included on the face 304 of the bus bar 160 so that a user can simply observe the channels 330 on the face 304 and identify the nature of the installed bus bar 160. For example, a pair of channels may correspond to a high capacity bus bar and a single channel may correspond to a low capacity bus bar. Other characteristics of the bus bars may also be coordinated with the number of small channels extruded into the profile of each bus bar. It should be noted that embodiments include extruding the bur bar 160 with the identification channels 330 so that the characteristics of the bus bar 160 associated with the identification channels 330 can be easily identified from the time the bus bar 160 is extruded.

Figure 6:
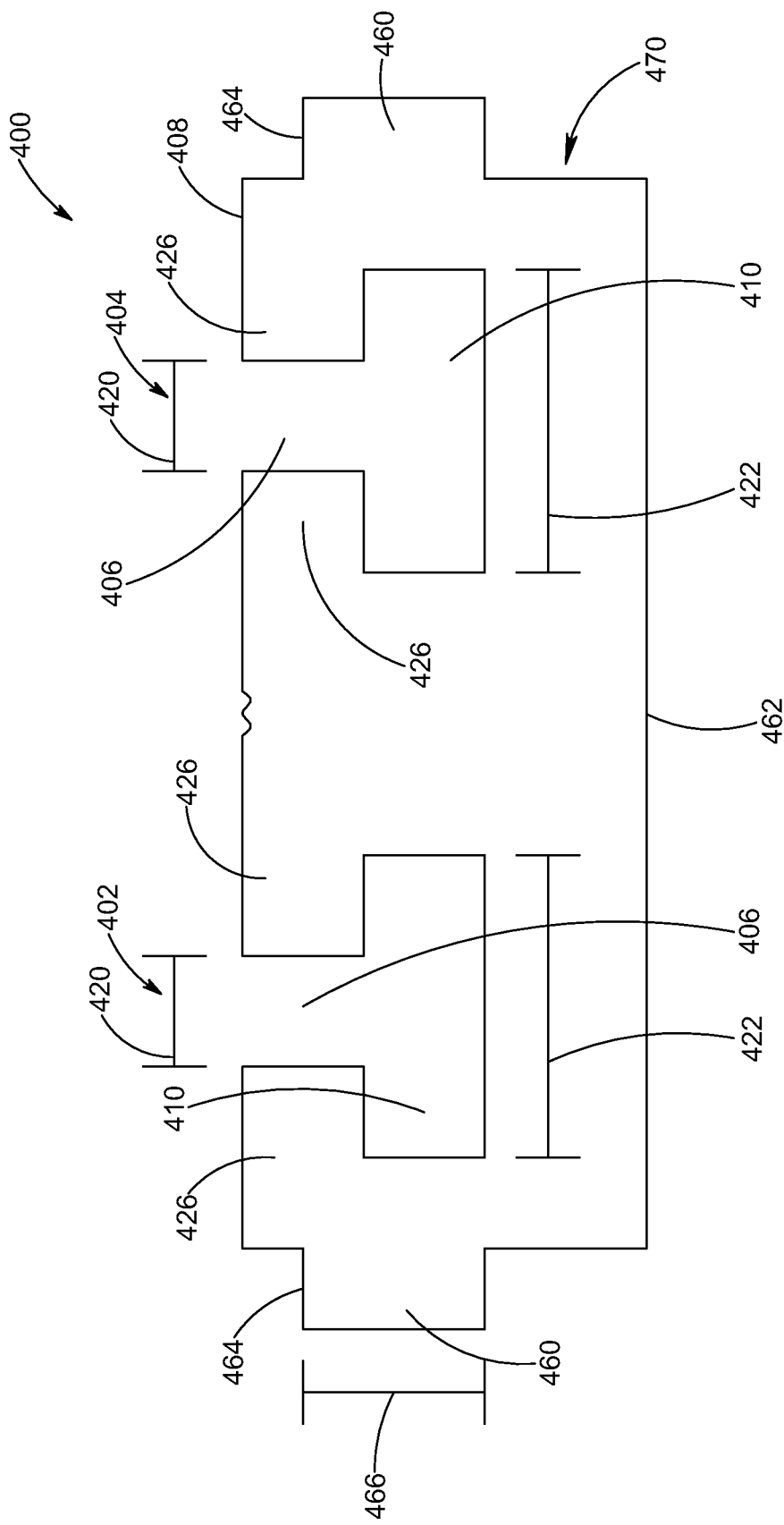
FIG. 6 is a cross-sectional view of a bus bar in accordance with present embodiments.
Figure 7:
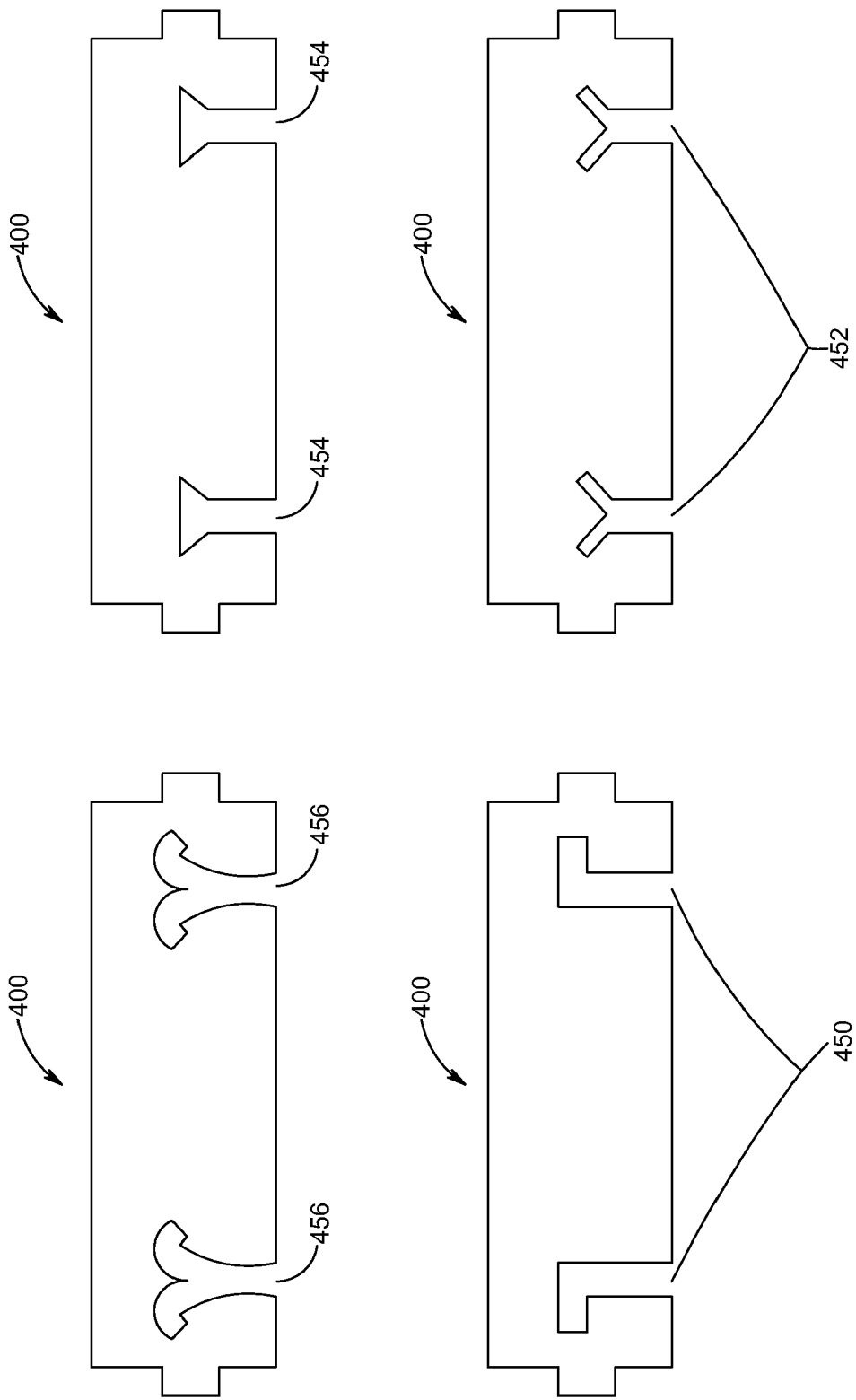
FIG. 7 illustrates various cross-sectional views of a bus bar with different groove cross-sections in accordance with present embodiments.

FIG. 6 is a cross-sectional view of a bus bar 400 in accordance with present embodiments. As with previously discussed embodiments, the bus bar 400 includes a first groove 402 and a second groove 404, wherein each groove 402, 404 includes a narrow channel 406 extending from a face 408 of the bus bar 400 and an expanded cavity 410 further into the body of the bus bar 400. The width of the narrow channel 406 is indicated by reference numeral 420 and the width of the expanded cavity 410 is indicated by reference numeral 422. The difference in widths 420 and 422 forms lips 426 over the expanded cavity 410. Indeed, the expanded cavity 410 is substantially wider than the narrow channel 406 to facilitate interlocking of attachment feature components with the grooves 402, 404 and engagement of the attachment feature components with the corresponding lips 426. The size of the lips 426 may vary depending on the ratio of the width of the channel 420 to the width of the cavity 422. In the illustrated embodiment, the ratio of the width of the channel to the width of the cavity is approximately 2:5. However, different ratios may be utilized in different embodiments. Additionally, while in the illustrated embodiment, the grooves 402, 404 include a substantially T-shaped cross-section, in other embodiments different cross-sections may be included. For example, as illustrated by FIG. 7, the bus bar 400 can include grooves with L-shaped cross-sections 450, Y-shaped cross-sections 452, triangular-shaped cross-sections 454, hook-shaped cross-sections 456, or a combination of such cross sections. Indeed, any of various cross-sections with a narrow entry point and a broadened cavity may be extruded into the bus bar 400. Having a symmetrical cross-section may be beneficial because it functions in the same manner regardless of which groove 402 or 404 is positioned on top.

Turning back to FIG. 6, the bus bar 400 also includes a pair of ridges 460 that extend from opposite edges of the bus bar 400. In the illustrated embodiment, these ridges are offset from the front face 408 and a rear face 462 of the bus bar 400. However, in other embodiments, a front wall 464 of one or both ridges 460 may be flush with the front face 408 of the bus bar 400 while remaining offset from the rear face 462 of the bus bar 400. A thickness of the ridges 460 is indicated by reference numeral 466. This thickness 466 and a positioning of the ridges 460 relative to the front face 408 of the bus bar 400 may be consistently maintained for various bus bars with different capacities to facilitate cooperation with support features 116 and so forth.

Figure 8:
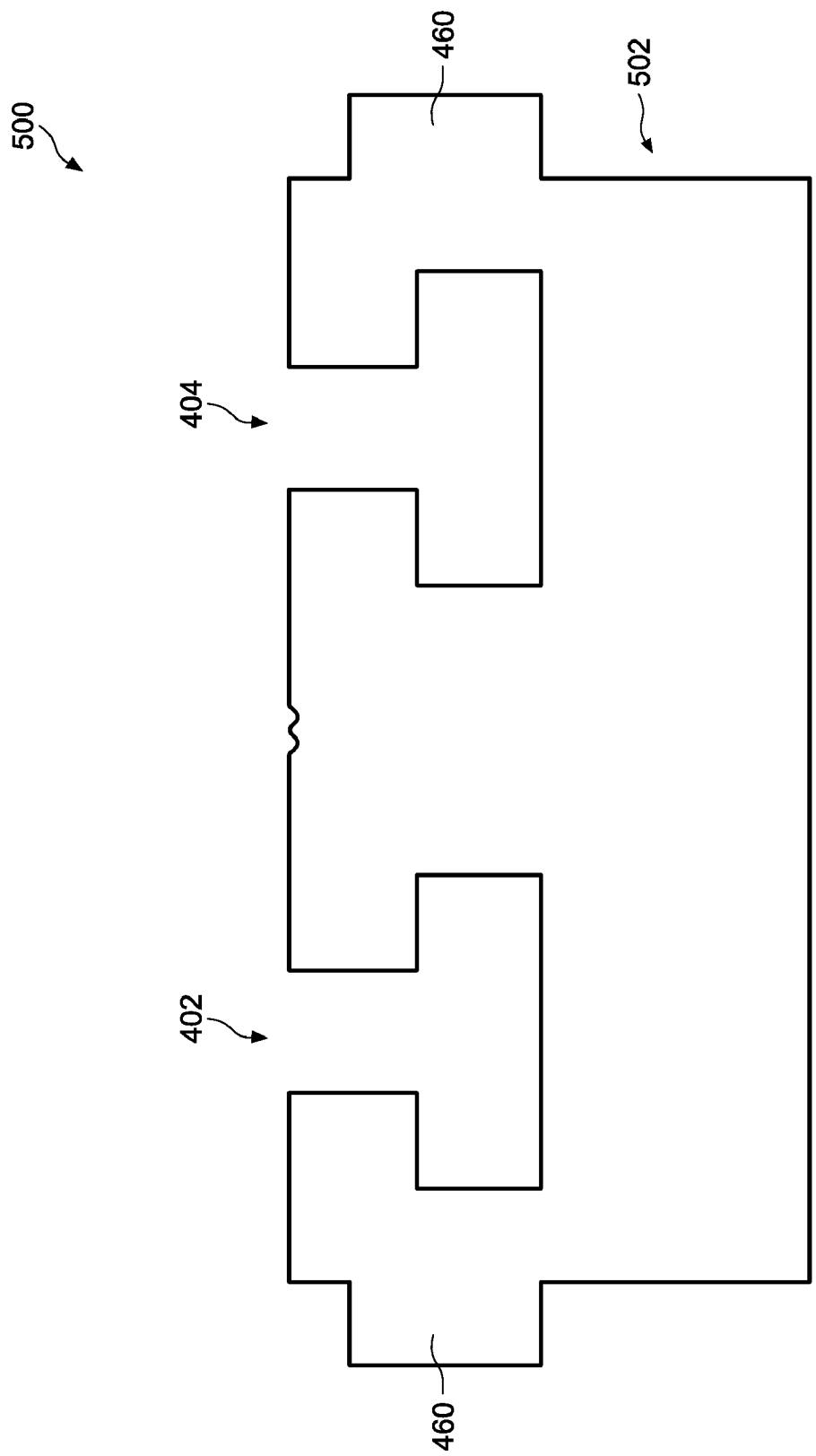
FIG. 8 depicts a bus bar that has been extruded with an enlarged rear portion to provide expanded capacity relative to the bus bar illustrated in FIG. 6 in accordance with present embodiments.

As briefly discussed above, a rear portion 470 of the bus bar 400 may be expanded in certain embodiments to provide additional capacity while maintaining the same geometric relationship of the groove features and ridge features. For example, FIG. 8 depicts a bus bar 500 with an expanded capacity relative to the bus bar 400 illustrated in FIG. 6. While the bus bar 500 includes an expanded rear portion 502 relative to the rear portion 470 of bus bar 400, the geometric relationships between the groove features and ridges remain the same. Accordingly, while the bus bar 500 has additional capacity, it has the same functionality as the bus bar 400 with respect to attachment of connection features with the grooves 402, 404 and positioning the ridges 460 within a support bracket. Indeed, the attachment features will naturally cooperate in the same way with identical grooves. Further, as will be discussed in detail below, the cooperation with the support brackets in accordance with present embodiments does not substantially change.

Figure 9:
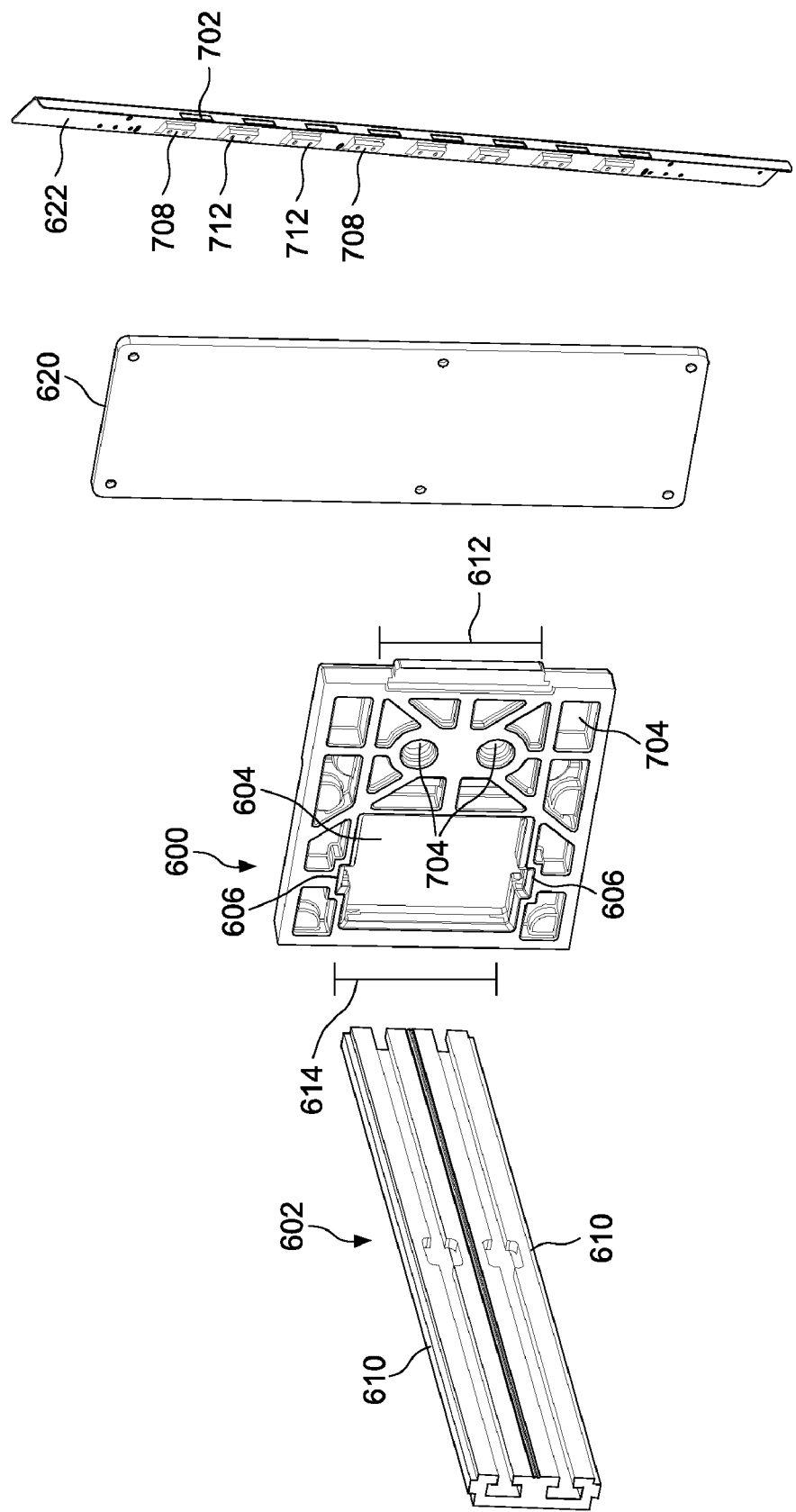
FIG. 9 is a perspective view of a support bracket exploded away from a bus bar in accordance with present embodiments.

FIG. 9 is a perspective view of a support bracket 600 exploded away from a bus bar 602 in accordance with present embodiments. In the illustrated embodiment, the support bracket 600 comprises compression molded thermalset glass reinforced material that includes a main opening 604 with slots 606 on either side of the main opening 604. The slots 606 are sized to receive ridges 610 on either side of the bus bar 602. Further, the main opening 604 has a height 612 that corresponds to a height 614 of a central portion of the bus bar 602 (excluding the added height of the ridges 610). Accordingly, when the bus bar 602 is positioned within the support bracket 600, the ridges 610 engage the slots 606 and prevent substantial rotation of the bus bar 602 about its lengthwise axis or movement in a direction traverse to its lengthwise axis. However, the engagement between the support bracket 600 and the bus bar 602 does permit lateral movement such that the bus bar 602 essentially floats within the bracket 600 without being fastened to the bracket 600, which facilitates attachment of other features to the bus bar 602. In should be noted that lateral movement is limited in accordance with present embodiments by end caps 620 that can be attached to the brackets 600 or by protective end pieces that are positioned on cabinet walls or other support features 622 adjacent the end of the bus bar 602. For example, an end cap may be fastened on to the bracket 600 via engagement features molded into the bracket 600. The end cap and/or protective end piece coupled to the support 622 may still provide some lateral leeway.

Figure 10:
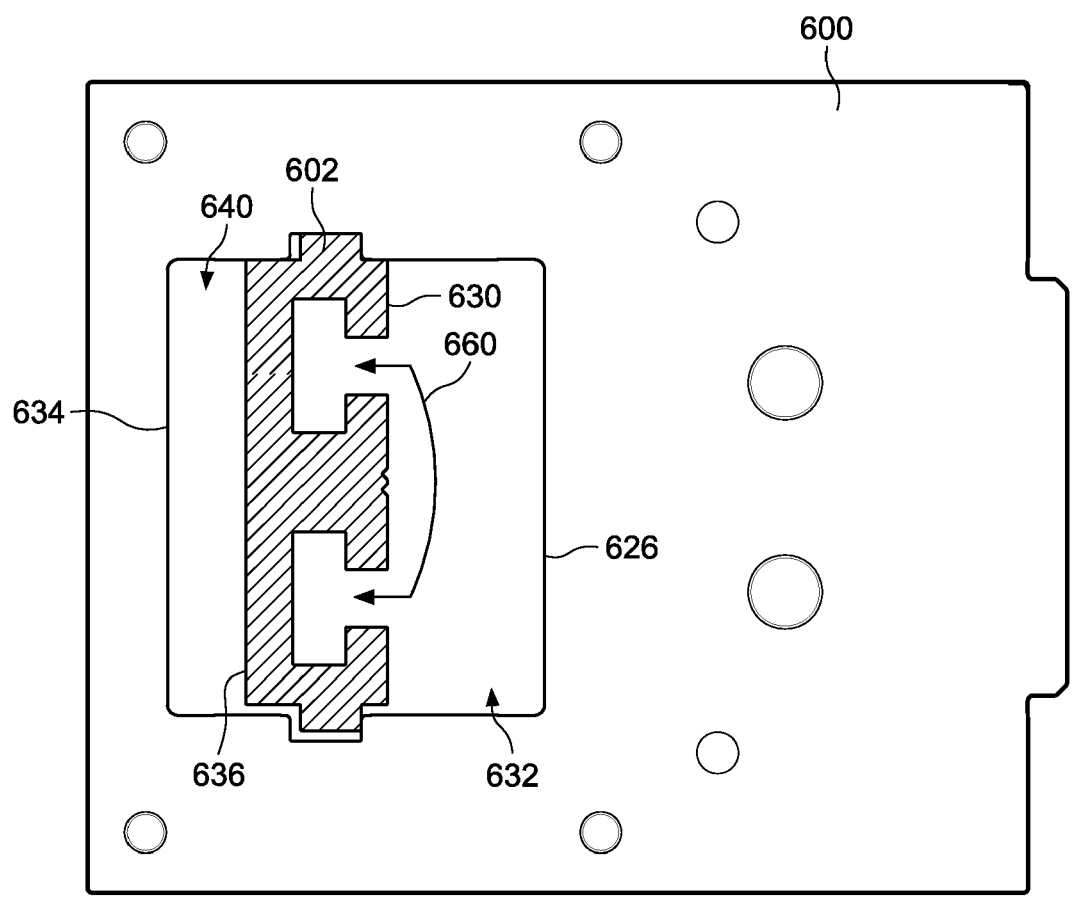
FIG. 10 is a cross-sectional view of a bus bar inserted into a bracket support in accordance with present embodiments.
Figure 11:
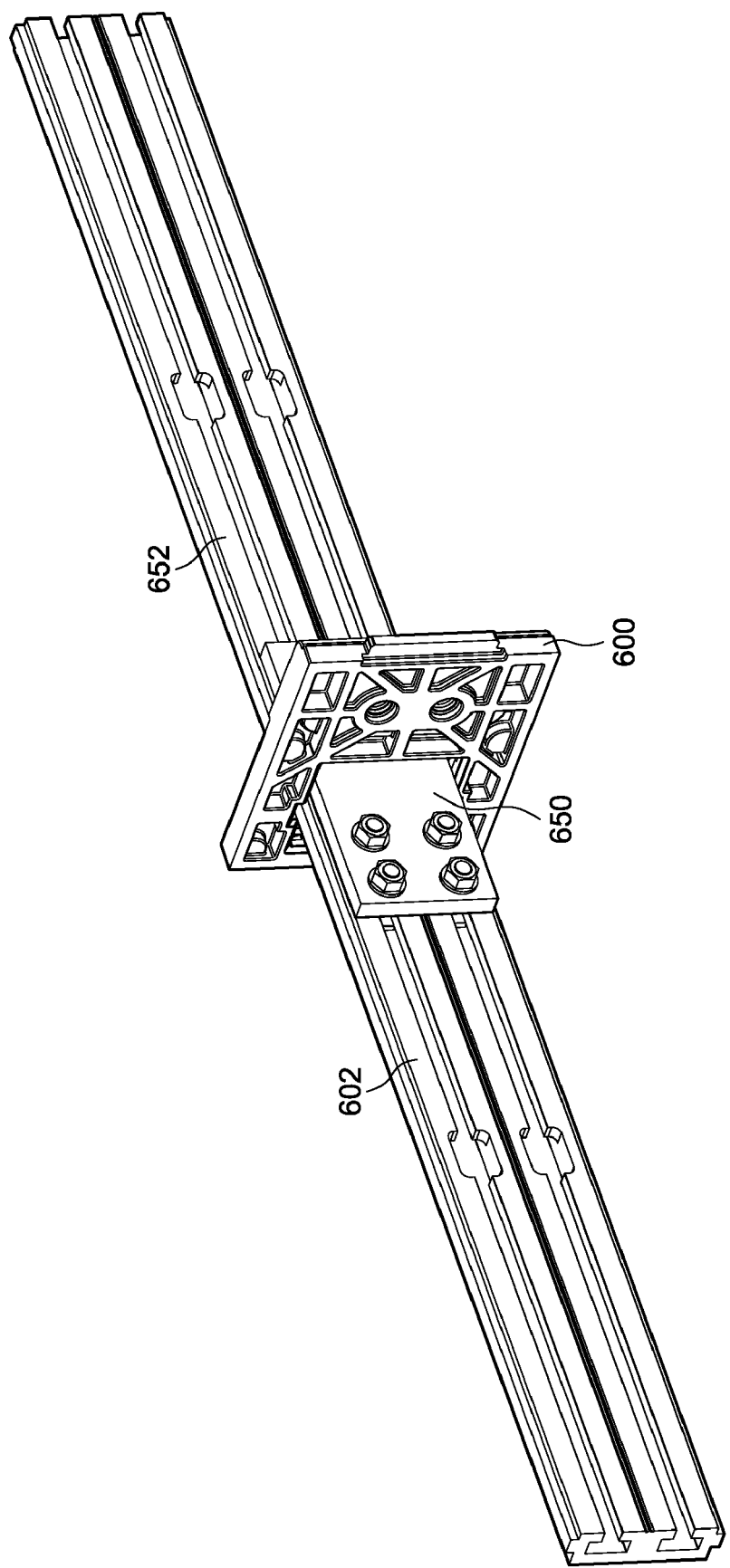
FIG. 11 is a perspective view of a splicing feature coupling a pair of bus bars in accordance with present embodiments.

The main opening 604 in the illustrated bracket 600 includes a certain amount of tolerance in width relative to the illustrated bus bar 602. For example, as can be seen in the cross-sectional view illustrated by FIG. 10, when the bus bar 602 is inserted into the bracket 600, there is extra space provided between the vertical edge 626 of the bracket 600 and a front face 630 of the bus bar 160, which may be referred to as front space 632. There is also extra space provided between the vertical edge 634 of the bracket 600 and a rear face 636 of the bus bar 160, which may be referred to as rear space 640. This additional space, with respect to the illustrated embodiment, is provided to enable flexibility with respect to increasing the capacity of the bus bar and adding length to the bus bar after manufacture. For example, as discussed above, a bus bar with added capacity relative to the illustrated bus bar may include an expanded rear section. Such an expanded rear section can be accommodated by the rear space 640. Thus, a single bracket type can be manufactured to handle a wide variety of bus bars with differing capacities. This is cost efficient and reduces complexity. Further, the front space 632 may be utilized to accommodate a splicing feature that joins the bus bar with another bus bar or with a conductive feature of an option bay. Indeed, while a bus bar can be extruded to essentially any length in accordance with present embodiments, it may be desirable to attach multiple bus bars together in series to communicate between bays and so forth. As illustrated in FIG. 11, this may be achieved by placing a splice 650 within the front space 626 and coupling the splice 650 to both the bus bar 602 and a second bus bar 652. As with other attachment features, the splice 650 may be coupled to grooves 660 in the bus bars. Specifically, the engagement features of the splice 650 may be slid through the ends of each bus bar 602, 652 and then tightened to retain the bus bars 602, 652 in position relative to one another.

The bracket 600 also includes mounting features 700 that facilitate tool-free coupling with an enclosure or support feature, such as the support feature 622. Indeed, in the illustrated embodiment, the mounting features 700 include tabs that can be passed through slots 702 in the support feature 622. In some embodiments, the dimensions of the mounting features 700 and the slots 702 may be such that a snap fit is obtained. Further, certain topographic features 704 on a face of the bracket 600 interlock with extensions or indentations within the support feature 622, such as indentation 708. Such features of the bracket 600 and the support feature 622 allow an installer to position the bracket 600 in a desired location without separate fasteners. Further, the mounting feature 700 cooperates with the other features so that the bracket 600 is held in place (hands free) while separate fasteners (e.g., screws) are passed through holes 710 in the bracket 600 and holes 712 in the support feature 622. Thus, present embodiments provide users with the tools to efficiently secure a bus system within an enclosure.

Figure 12:
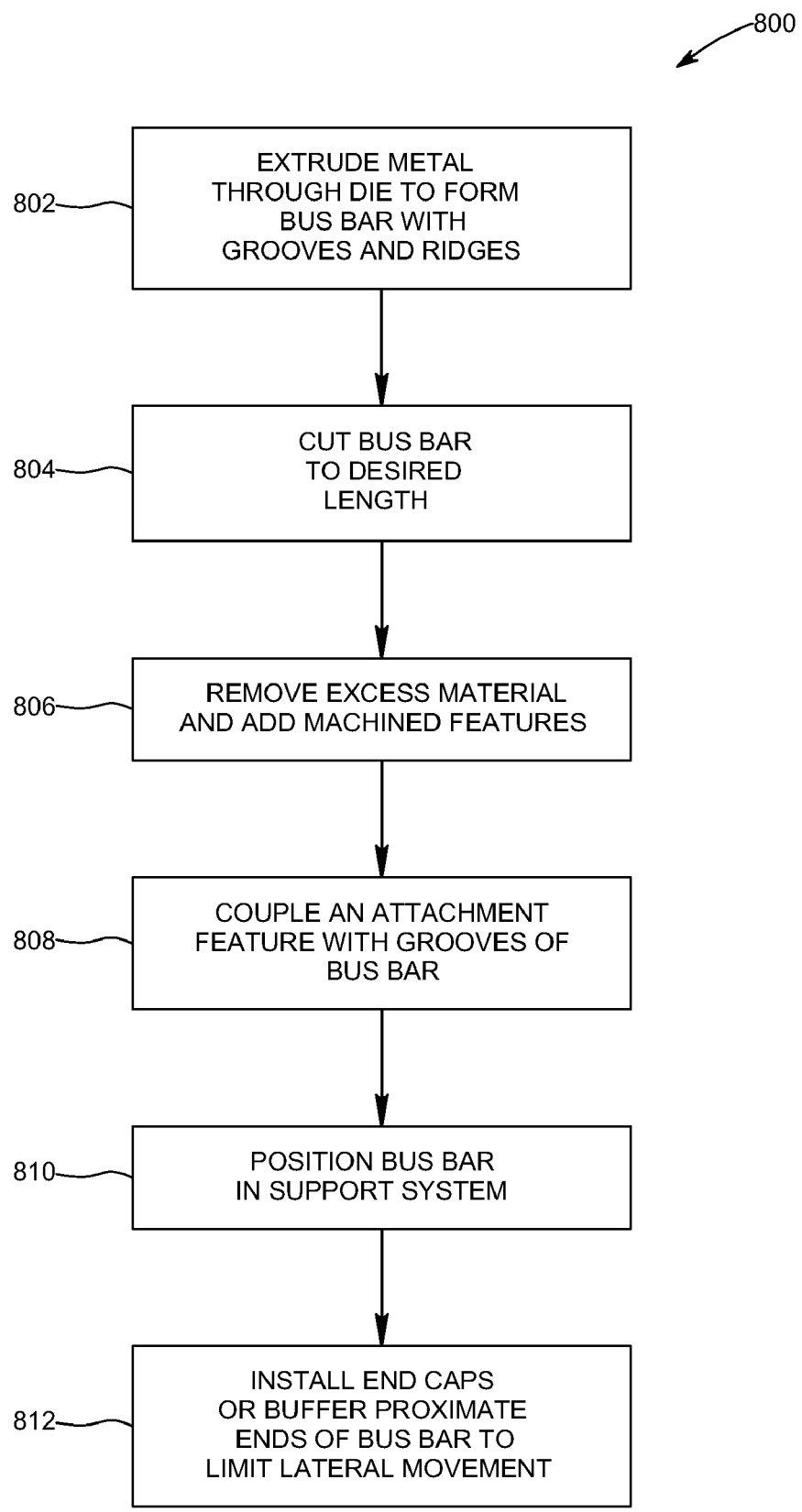
FIG. 12 is a process flow diagram of a method for producing a bus bar system in accordance with present embodiments.

FIG. 12 is a process flow diagram of a method 800 of manufacturing and assembling a bus bar system in accordance with present embodiments. The process begins with extruding metal through a die of an extrusion system to form a bus bar, as represented by block 802. The extruder die may be configured to provide a bus bar with a body, a pair of ridges disposed along a length of the body such that they extend from opposite edges of the body, and at least a pair of grooves along the length of the body. The grooves extend into the body from a face of the body such that each of the grooves has a cross-section with a narrow passage extending from the face to a broadened cavity within the body. The procedure illustrate by block 802 may include adjusting the extruder die such that a portion of the body opposite the face of the body is extended or reduced to provide additional or less electrical transmission capacity, respectively, through the elongate metal extrusion. This may be done without changing the geometry of the ridges and/or grooves. Once such an extrusion system is set up with an appropriate die, bus bars with varying lengths and duplicated cross-sections can be manufactured very efficiently.

Once the bus bar is extruded, as represented by block 802, the bus bar is cut to a desired length, as represented by block 804. Further, the bus bar may be machined to remove excess material and to provide additional features. For example, block 806 represents machining an opening into each groove such that each machined opening is configured to accommodate insertion of an attachment feature having an enlarged distill end and a narrowed neck. The method may also include inserting an attachment feature into one of the grooves (e.g., via the machined opening) so that the attachment feature can slide along the groove, as represented by block 808.

The method 800 may also include assembling the bus bar within a bus support system. For example, block 810 represents disposing the bus bar within a non-conductive support bracket such that the first and second ridges pass through slots on either side of a major opening in the bracket and the body is disposed within the major opening. Further, the bracket can be coupled to an interior feature of an electrical enclosure such that the bus bar extends along the electrical enclosure, as represented by block 810. Non-conductive end caps or protective pieces may then be placed between the ends of the bus bar and the cabinet either by coupling such pieces to the bracket or the cabinet such that the bus bar can essentially float within the bracket without being directly fastened to the bracket, as represented by block 812.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electrical distribution bus system, comprising:
   an elongate metal body;
   a first groove and a second groove along the length of the body and extending into the body from a face of the body such that each of the first and second grooves comprises a cross-section having a narrow passage extending from the face into a broader cavity within the body; and
   an opening into each of the first groove and the second groove, wherein each opening is wider than each corresponding groove in a direction traverse to the length of each groove.

2. The system of claim 1, wherein the first and/or second groove comprises a T-shaped, Y-shaped, triangular-shaped, or L-shaped cross-section.

3. The system of claim 1, wherein the cross-section of the first and/or second groove is configured to accommodate insertion of an attachment feature having an enlarged distal end and a narrowed neck such that, once inserted into the first groove or the second groove, the attachment feature can slide along the groove into which the attachment feature was inserted, engage the enlarged distal end with the broader cavity, and engage the narrowed neck with the narrow passage.

4. The system of claim 1, wherein a ratio of the width of the narrow passage to the width of the broader cavity of the first and/or second groove is approximately 10:15.

5. The system of claim 1, wherein the elongate metal body comprises extruded copper or aluminum.

6. The system of claim 1, comprising a side bus coupled to the body via side bus couplings passing through a portion of the side bus and engaged with the first and second grooves such that the side bus is in electrical communication with the body and extends substantially perpendicularly from the body.

7. The system of claim 1, comprising an additional elongate metal body coupled with the elongate metal body via a splice.

8. The system of claim 7, comprising a support bracket disposed around the splice, the bracket comprising a non-conductive material having slots on either side of a major opening, wherein the slots are configured to engage a pair of ridges along a length of the elongate metal body or the additional elongate metal body, wherein each ridge extends from an opposite edge of the elongate metal body or the additional elongate metal body.

9. The system of claim 8, wherein the major opening is configured to accommodate a thickness of the elongate metal body or the additional elongate metal body and the thickness of the splice, wherein the splice is coupled to the first and/or second grooves on the face of the elongate metal body.

10. The system of claim 1, comprising one or more shallow grooves disposed between the first groove and the second groove and corresponding to a thickness and/or metal type of the elongate metal body to facilitate identification of the conductive capabilities of the elongate metal body.

11. The system of claim 10, wherein a number of shallow grooves correlates to the thickness of the elongate metal body.

12. An electrical distribution bus system, comprising:
an elongate metal body;
a first groove and a second groove along the length of the body and extending into the body from a face of the body such that each of the first and second grooves comprises a cross-section having a narrow passage extending from the face into a broader cavity within the body;
an opening into each of the first groove and the second groove, wherein each opening is wider than each corresponding groove in a direction traverse to the length of each groove; and
a non-conductive support bracket disposed about the body, first and second ridges extending from either side of the body passing through slots on either side of a major opening in the bracket to support the body within the major opening.

13. The system of claim 12, comprising an additional elongate metal body coupled with the elongate metal body via a splice, wherein the support bracket is disposed around the splice.

14. The system of claim 13, wherein the major opening is configured to accommodate a thickness of the elongate metal body or the additional elongate metal body and the thickness of the splice, wherein the splice is coupled to the first and/or second grooves on the face of the elongate metal body.

15. The system of claim 12, wherein each opening is wider, in the direction traverse to the length of each groove, than the portion of each corresponding groove including the broader cavity.

16. The system of claim 12, wherein the cross-section of the first and/or second groove is configured to accommodate insertion of an attachment feature having an enlarged distal end and a narrowed neck such that, once inserted into the first groove or the second groove, the attachment feature can slide along the groove into which the attachment feature was inserted, engage the enlarged distal end with the broader cavity, and engage the narrowed neck with the narrow passage.

17. The system of claim 12, comprising a side bus coupled to the body via side bus couplings passing through the side bus and engaged with the first and second grooves along the body such that the side bus is in electrical communication with the body and extends substantially perpendicularly from the body.

18. The system of claim 12, comprising one or more shallow grooves disposed between the first groove and the second groove and corresponding to a thickness and/or metal type of the elongate metal body to facilitate identification of the conductive capabilities of the elongate metal body.

19. An electrical distribution bus system, comprising:
an elongate metal body;
a first groove and a second groove along the length of the body and extending into the body from a face of the body such that each of the first and second grooves comprises a cross-section having a narrow passage extending from the face into a broader cavity within the body; and
a non-conductive support bracket disposed about the body, first and second ridges extending from either side of the body passing through slots on either side of a major opening in the bracket to support the body within the major opening.

20. The system of claim 19, comprising an additional elongate metal body coupled with the elongate metal body via a splice, wherein the support bracket is disposed around the splice.

21. The system of claim 20, wherein the major opening is configured to accommodate a thickness of the elongate metal body or the additional elongate metal body and the thickness of the splice, wherein the splice is coupled to the first and/or second grooves on the face of the elongate metal body.

22. The system of claim 19, wherein the first and/or second groove comprises a T-shaped, Y-shaped, triangular-shaped, or L-shaped cross-section.

23. The system of claim 19, wherein the cross-section of the first and/or second groove is configured to accommodate insertion of an attachment feature having an enlarged distal end and a narrowed neck such that, once inserted into the first groove or the second groove, the attachment feature can slide along the groove into which the attachment feature was inserted, engage the enlarged distal end with the broader cavity, and engage the narrowed neck with the narrow passage.

24. The system of claim 19, comprising a side bus coupled to the body via side bus couplings passing through the side bus and engaged with the first and second grooves along the body such that the side bus is in electrical communication with the body and extends substantially perpendicularly from the body.

25. The system of claim 19, comprising one or more shallow grooves disposed between the first groove and the second groove and corresponding to a thickness and/or metal type of the elongate metal body to facilitate identification of the conductive capabilities of the elongate metal body.

26. The system of claim 3, wherein the opening is configured to facilitate insertion of the attachment feature into the first and/or second groove via a face of the body.

* * * * *